(12) United States Patent
Wong et al.

(10) Patent No.: US 6,943,419 B2
(45) Date of Patent: Sep. 13, 2005

(54) HERMETICALLY PACKAGING A MICROELECTROMECHANICAL SWITCH AND A FILM BULK ACOUSTIC RESONATOR

(75) Inventors: Daniel M. Wong, Fremont, CA (US); John Heck, Mountain View, CA (US); Valluri Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 10/772,507

(22) Filed: Feb. 5, 2004

(65) Prior Publication Data

US 2004/0157367 A1 Aug. 12, 2004

Related U.S. Application Data

(62) Division of application No. 10/218,729, filed on Aug. 14, 2002, now Pat. No. 6,713,314.

(51) Int. Cl.⁷ ............................................... H01L 29/82
(52) U.S. Cl. ....................................................... 257/416
(58) Field of Search ................................. 257/414–416, 257/728

(56) References Cited

U.S. PATENT DOCUMENTS

| | | | | |
|---|---|---|---|---|
| 5,668,033 A | * | 9/1997 | Ohara et al. ................. | 438/113 |
| 6,025,767 A | * | 2/2000 | Kellam et al. ............... | 335/128 |
| 6,114,794 A | * | 9/2000 | Dhuler et al. ................ | 310/307 |
| 6,392,144 B1 | * | 5/2002 | Filter et al. ................. | 174/52.4 |
| 6,436,853 B2 | * | 8/2002 | Lin et al. ..................... | 438/800 |

* cited by examiner

Primary Examiner—David A. Zarneke
(74) Attorney, Agent, or Firm—Trop, Pruner & Hu, P.C.

(57) ABSTRACT

A film bulk acoustic resonator wafer and microelectromechanical switch wafer may be combined together in face-to-face abutment with sealing material between the wafers to define individual modules. Electrical interconnects can be made between the switch and the film bulk acoustic resonator within a hermetically sealed chamber defined between the switch and the film bulk acoustic resonator.

13 Claims, 3 Drawing Sheets

HERMETICALLY PACKAGING A MICROELECTROMECHANICAL SWITCH AND A FILM BULK ACOUSTIC RESONATOR

This is a divisional of prior application Ser. No. 10/218,729, filed Aug. 14, 2002 now U.S. Pat. No. 6,713,314.

BACKGROUND

This invention relates generally to microelectromechanical system (MEMS) radio frequency switches and film bulk acoustic resonator filters.

In a number of radio frequency applications, a radio frequency MEMS switch and a film bulk acoustic resonator filter are used together. Currently, filter devices, such as film bulk acoustic resonators, are packaged individually. If one desires to utilize a MEMS switch with such filter devices, an interpackage connection would be needed. As a result, a considerable amount of space on a circuit board is required to interconnect both the switches and the individually packaged filter devices. Interconnections between the devices must be provided that may increase costs as well as parasitic capacitance.

It is also relatively difficult to handle the small dies associated with the radio frequency MEMS switch and the film bulk acoustic resonator. It is relatively awkward to interconnect these dies and the size of resulting structure may be considerable.

Thus, there is a need for better ways to assemble film bulk acoustic resonators with microelectromechanical system radio frequency switches.

DETAILED DESCRIPTION

Figure 1:
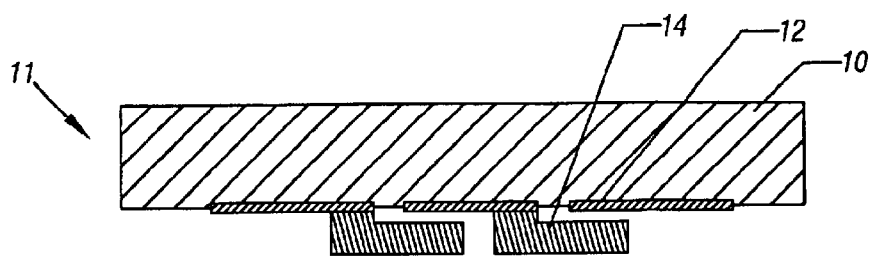
FIG. 1 is an enlarged cross-sectional view of a microelectromechanical system switch in accordance with one embodiment of the present invention.

Referring to FIG. 1, a microelectromechanical system (MEMS) radio frequency (RF) switch 11 may be formed on a substrate 10. The switch 11 may include a cantilevered switch element 14 that is electrostatically attracted towards and away from the substrate 10 to make or break contact with the contact 12. In one embodiment, an electric field may be utilized to attract the cantilevered switch element 14 to make contact with the contact 12.

Figure 2:
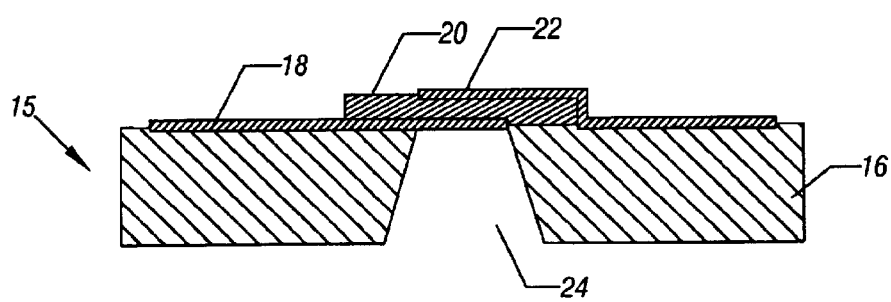
FIG. 2 is an enlarged cross-sectional view of a film bulk acoustic resonator in accordance with one embodiment of the present invention.

Referring to FIG. 2, a film bulk acoustic resonator (FBAR) 15 in accordance with one embodiment of the present invention may be formed on a substrate 16 with a backside cavity 24. An upper electrode 22 and a lower electrode 18 may sandwich a piezoelectric film 20.

Figure 3:
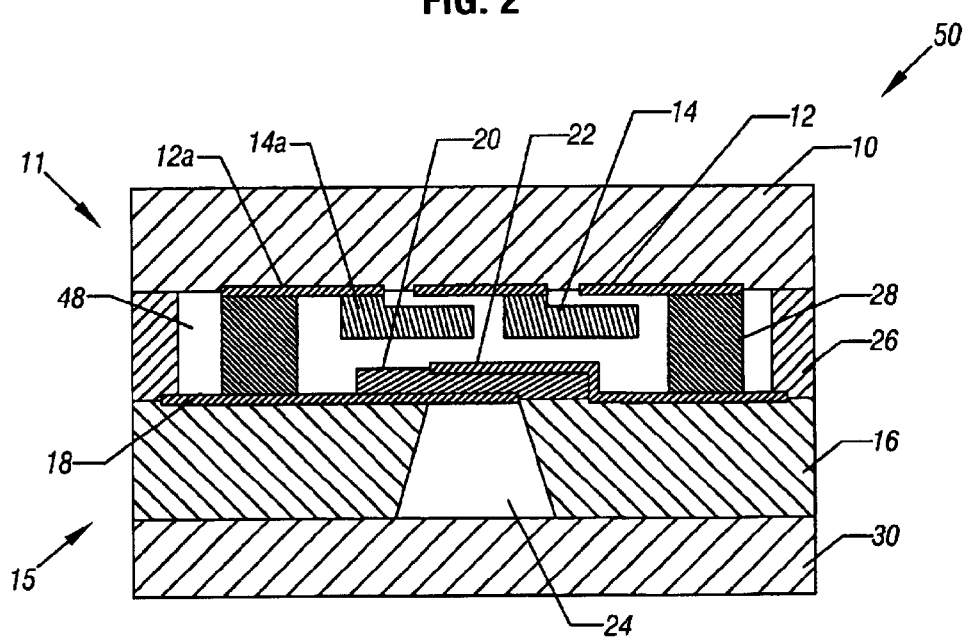
FIG. 3 is an enlarged cross-sectional view of a module including the switch of FIG. 1 and the film bulk acoustic resonator of FIG. 2 in accordance with one embodiment of the present invention.

Referring to FIG. 3, the switch 11 may be assembled in an inverted configuration on the film bulk acoustic resonator 15 using a hermetic sealing material 26 and a conductive interconnect 28. The interconnect 28 may make an electrical connection between the upper electrode 22 and the contact 12a and between the lower electrode 18 and the contact 12b associated with the switch element 14a. In some embodiments, the interconnect 28 material may be a metal bonding material such as a solder joint or a metal thermocompression bonding, to mention two examples.

A chamber 48 may be defined between the switch 11 and the FBAR 15 using the hermetic sealing material 26. The material 26 may be a solder ring, frit glass ring, anodic bonding, or a plastic ring, to mention a few examples. Suitable plastic rings includes those made of epoxy, resin, or a polymer such as benzocyclobutene (BCB).

As a result, the switch 11 may be packaged in close proximity to the FBAR 15, reducing the interconnection length and simplifying the interconnection process. This may result in better RF performance, fewer components, and a smaller footprint in some embodiments of the present invention. In addition, the module may have lower costs than separate switch and filter devices. Also, the packaging may be implemented at the wafer level.

Thus, a wafer containing a large number of switches 11 and FBARs 15 may be combined together to define individual modules 50, which are subsequently separated from the wafer, forming, at the same time, a large number of modules 50. In one embodiment of the present invention, one or both of the wafers, including the switches 11 and/or the FBARs 15, may have the conductive interconnect material 28 formed thereon before combining with the other of the switch or FBAR. The conductive material 28 may be applied using thick resist or electroplating, as two examples. One or both of the wafers may also have the sealing material 26 preapplied. The FBAR 15 and switch 11 may be assembled together, at the wafer level, using an assembly tool such as a wafer bonder. In some embodiments, this assembly may be done in a dry ambient at a specified pressure. The cavity 24 in the backside of the FBAR 15 wafer can be made either before or after the wafers are assembled into the module 50. A wafer 30 may be applied over the backside cavity 24 to form the module 50.

Figure 4:
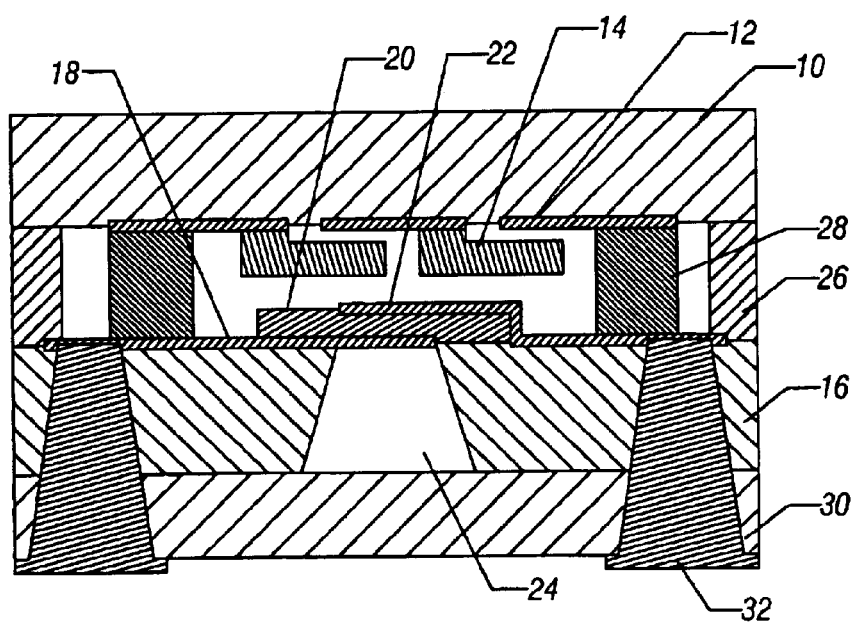
FIG. 4 is an enlarged cross-sectional view of the embodiment shown in FIG. 3 after further processing in accordance with one embodiment of the present invention.
Figure 5:
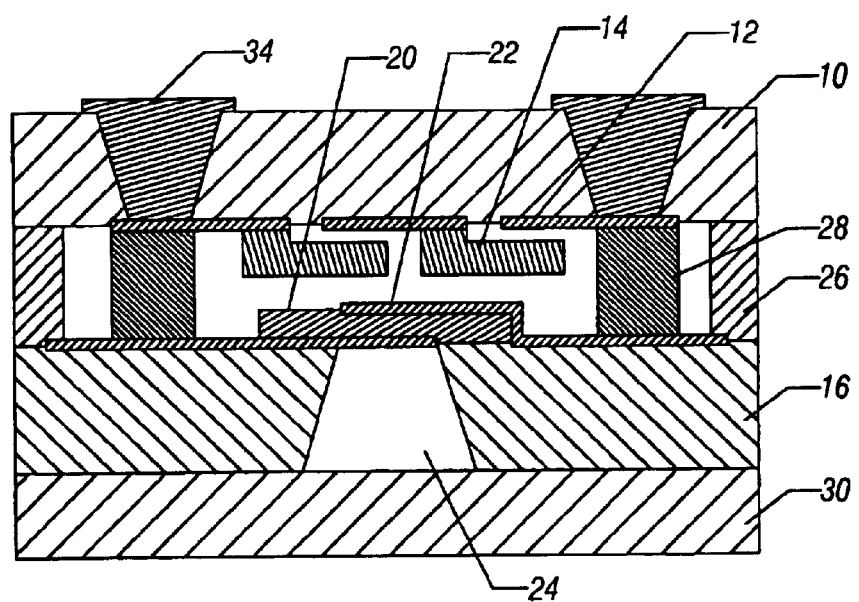
FIG. 5 is a cross-sectional view of the embodiment shown in FIG. 3 after further processing in accordance with another embodiment of the present invention.
Figure 6:
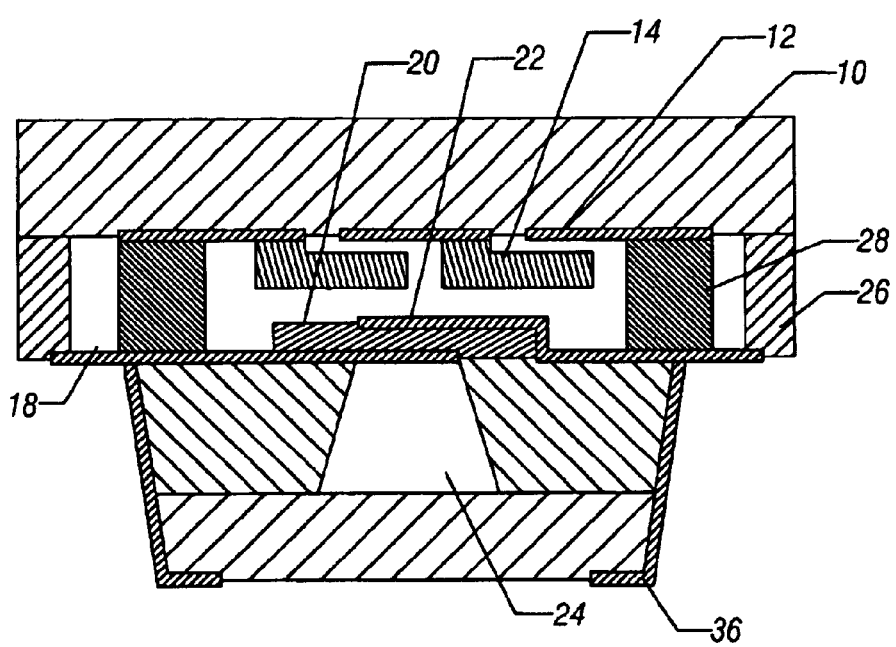
FIG. 6 is an enlarged cross-sectional view of the embodiment shown in FIG. 3 after further processing in accordance with yet another embodiment of the present invention.

Referring to FIGS. 4 through 6, a variety of techniques may be used to form interconnects from the outside world to the switch 11 and the FBAR 15. Referring to FIG. 4, a metal via 32 may be formed through the layer 30 down to the upper electrode 22 and the lower electrode 20 of the FBAR 15 in one embodiment of the present invention.

Alternatively, as shown in FIG. 5, metal vias 34 may be formed from the top through the substrate 10 of the switch 11 to make electrical contact with the contacts 12 of the switch 11.

In accordance with still another embodiment of the present invention, electrical interconnections may be made by sawing through the wafer 30 and the wafer including the FBAR 15 to create the tapered shape shown in FIG. 6. The FBAR 15 may then be coated with a contact metal 36 that makes electrical connections to the upper and lower electrodes 22 and 18 of the FBAR 15. In some embodiments, the tapered structure may be formed by sawing at the wafer level.

In one embodiment, the FBAR membrane may not be released when the switch 11 and FBAR 15 wafers are bonded together. In this embodiment, the FBAR 15 still needs a backside silicon etch, that may be done either using a wet etch such as KOH or tetramethylammonium hydroxide (TMAH), or by backside grinding the FBAR wafer and using a plasma etch. The packaging may be completed afterwards by bonding the wafer 30 to the backside of the filter 15 wafer.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A packaged electronic device comprising:
    a microelectromechanical switch including a first surface having a cantilevered switch element;
    a film bulk acoustic resonator having a first surface having upper and lower electrodes and a piezoelectric film formed thereon;
    said switch and said resonator arranged with said first surfaces in opposition to one another; and
    a sealing ring between said surfaces to define a chamber between said switch and said resonator.

2. The device of claim 1 including electrical contacts between said switch and said resonator extending through said chamber.

3. The device of claim 1 wherein said resonator includes a cavity in a second surface of said resonator, said cavity being covered by a substrate.

4. The device of claim 1 including contacts extending from the exterior of said device through said resonator to contact at least one of said electrodes.

5. The device of claim 1 including contacts that extend from the exterior of said device through said switch to make electrical contact with said switch on its first surface.

6. The device of claim 1 wherein said resonator has tapered exterior conductive surfaces that make electrical contact with said electrodes.

7. A semiconductor assembly comprising:
    a first wafer including a microelectromechanical switch formed thereon on a first face of said first wafer;
    a second wafer with a film bulk acoustic resonator formed on a first face of said second wafer; and
    said wafers connected in first face-to-first face alignment.

8. The assembly of claim 7 including a sealing material around the first faces of said wafers to define a hermetically sealed chamber between said wafers.

9. The assembly of claim 7 wherein said second wafer includes a backside cavity and a third wafer formed over said backside cavity.

10. The assembly of claim 7 including a conductive contact extending between said film bulk acoustic resonator and said microelectromechanical switch.

11. The assembly of claim 7 further including a contact extending from the exterior of said assembly through said wafer with said film bulk acoustic resonator to make contact electrically with said film bulk acoustic resonator.

12. The assembly of claim 7 including a contact on the exterior of said assembly and extending through said wafer with said microelectromechanical switch.

13. The assembly of claim 7 including a notch formed in said film bulk acoustic resonator to enable electrical connection from the outside world to said film bulk acoustic resonator.

* * * * *